(12) United States Patent
Mende et al.

(10) Patent No.: US 10,753,961 B2
(45) Date of Patent: Aug. 25, 2020

(54) SHIELDED PROBE TIP INTERFACE

(71) Applicant: Tektronix, Inc., Beaverton, OR (US)

(72) Inventors: Michael J. Mende, Portland, OR (US);
David T. Engquist, Portland, OR (US);
Richard A. Booman, Lake Oswego, OR (US)

(73) Assignee: Tektronix, Inc., Beaverton, OR (US)

(*) Notice: Subject to any disclaimer, the term of this patent is extended or adjusted under 35 U.S.C. 154(b) by 0 days.

(21) Appl. No.: 15/687,316

(22) Filed: Aug. 25, 2017

(65) Prior Publication Data
US 2018/0328962 A1 Nov. 15, 2018

Related U.S. Application Data

(60) Provisional application No. 62/504,336, filed on May 10, 2017.

(51) Int. Cl.
*G01R 1/18* (2006.01)
*G01R 1/067* (2006.01)
*G01R 1/04* (2006.01)

(52) U.S. Cl.
CPC ............ *G01R 1/18* (2013.01); *G01R 1/0416* (2013.01); *G01R 1/06738* (2013.01); *G01R 1/06772* (2013.01)

(58) Field of Classification Search
CPC ... G01R 3/00; G01R 1/18; G01R 1/30; G01R 1/0416; G01R 1/06738; G01R 1/06772
USPC .............. 324/750.27, 437, 445, 446, 754.01, 324/754.03, 754.07, 754.1, 754.11, 324/754.21, 754.26, 755.03, 758.01, 690, 324/696, 715
See application file for complete search history.

(56) References Cited

U.S. PATENT DOCUMENTS

| | | | | |
|---|---|---|---|---|
| 4,774,462 A | * | 9/1988 | Black | G01R 1/04 324/754.03 |
| 4,857,831 A | * | 8/1989 | Davies | E21B 47/00 324/357 |
| 5,218,293 A | * | 6/1993 | Kan | G01R 1/06772 324/754.14 |
| 5,223,787 A | * | 6/1993 | Smith | G01R 1/0416 324/72.5 |

(Continued)

OTHER PUBLICATIONS

European Patent Office, Extended European Search Report and Opinion for European Patent Application 18171710.9, dated Oct. 5, 2018, 8 pages, European Patent Office, Munich, Germany.

*Primary Examiner* — Patrick Assouad
*Assistant Examiner* — Taqi R Nasir
(74) *Attorney, Agent, or Firm* — Miller Nash Graham & Dunn; Andrew J. Harrington

(57) ABSTRACT

Disclosed is a differential test probe tip. The probe tip comprises a socket of electrically conductive material at a proximate end of the probe tip. The socket includes a concavity to receive a signal pin. The probe tip also comprises a reference body of conductive material surrounding the socket. The probe tip further comprises a insulating spacer element of non-conductive material surrounding the reference body at the proximate end of the probe tip. The insulating spacer element includes a signal port to receive the signal pin into the socket. The insulating spacer element further includes a reference port to receive a reference pin and maintain the reference pin in electrical communication with a proximate end of the reference body.

18 Claims, 5 Drawing Sheets

(56) References Cited

U.S. PATENT DOCUMENTS

| | | | | |
|---|---|---|---|---|
| 5,559,446 A * | 9/1996 | Sano | .................... | G01R 1/0735 |
| | | | | 324/750.03 |
| 6,032,356 A * | 3/2000 | Eldridge | ................. | H01L 24/72 |
| | | | | 257/E21.503 |
| 2003/0160626 A1* | 8/2003 | Maruyama | ......... | G01R 31/2886 |
| | | | | 324/754.03 |
| 2004/0157493 A1* | 8/2004 | Bergner | ................. | H01R 9/032 |
| | | | | 439/607.41 |
| 2012/0306521 A1* | 12/2012 | Nickel | ............... | G01R 31/3025 |
| | | | | 324/754.03 |

* cited by examiner

US 10,753,961 B2

SHIELDED PROBE TIP INTERFACE

CROSS-REFERENCES TO RELATED APPLICATIONS

The present application claims benefit from U.S. Provisional Patent Application Ser. No. 62/504,336, filed May 10, 2017, and entitled "Shielded Square Pin Probe Tip Interface," which is incorporated herein by reference as if reproduced in its entirety.

FIELD OF THE INVENTION

This disclosure is directed to mechanisms associated with aspects of a test and measurement probe, and, more particularly, to a shielded test probe tip for connection to a Device Under Test (DUT).

BACKGROUND

Test and measurement systems (e.g. oscilloscopes) are designed to receive and test signals, for example from a DUT. In some example test networks, probes are employed to engage with signal pins on the DUT and electrically conduct the test signals toward the test and measurement system. Parasitic capacitances between probe elements may alter the frequency response of the probe, and hence change the test signals traversing the probe. In addition, current may be induced between adjacent DUT pins. Such induced current is not initially present in the DUT, and hence is noise that negatively impacts the test signal. Also, probes may be attached to pins via exposed wires, clips, and the like. Such components may increase the amount of induced current and also introduce variability in the amount of induced current. These components may add inconsistent signal connections to the test network, and hence add corresponding noise in the test signals. Such electrical noise has been a limiting factor in probe system performance, however modern test systems with optical isolation and high resolution capabilities can be used in environments with much higher ambient signals which can induce higher currents and noise into the test system. Hence, probe noise may make a noticeable difference in the test results of test and measurement systems.

Examples in the disclosure address these and other issues.

BRIEF DESCRIPTION OF THE DRAWINGS

Aspects, features and advantages of embodiments of the present disclosure will become apparent from the following description of embodiments in reference to the appended drawings in which.

DETAILED DESCRIPTION

Figure 1:
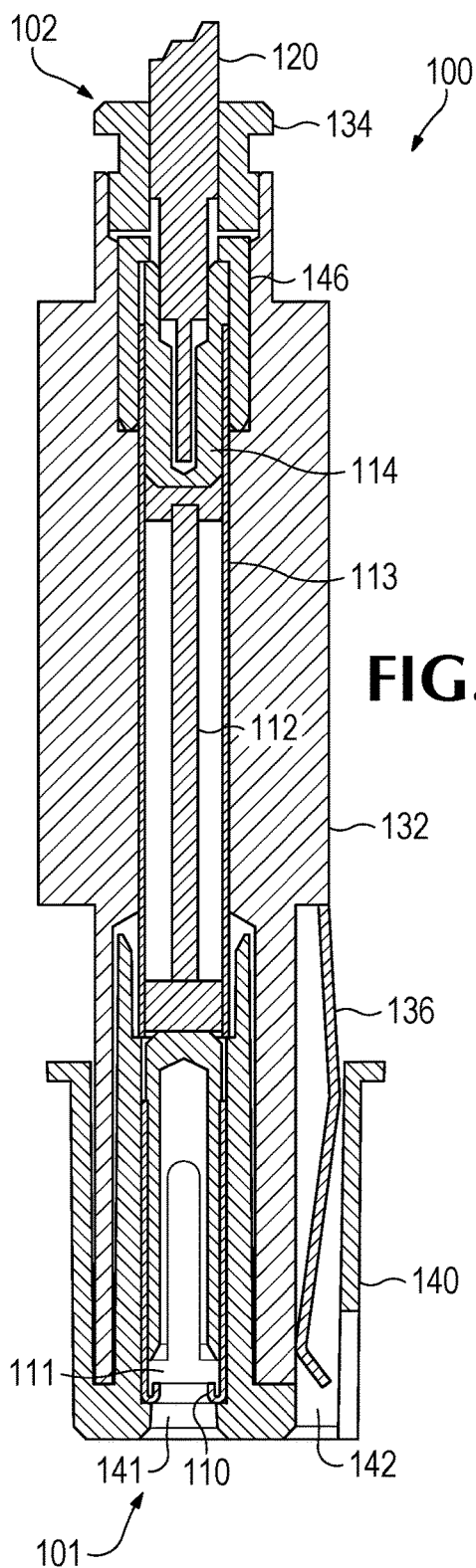
FIG. 1 is a cross sectional side view of an example shielded probe tip.

Square pins may be employed to obtain test signals from a DUT. One approach for connecting to the DUT uses exposed leads connected to square pins that have been soldered down to the DUT. These leads have no mechanism of isolating the reference or differential signals from common-mode signals. In addition, the uncontrolled impedance of the dual leads has a negative impact on the frequency response of the system leading to loss of bandwidth and increased aberrations. Few, if any, mechanisms exist for coupling to a pair of differential pins mounted on a DUT, and connecting such pins to a coaxial signal acquisition system that preserves the frequency response of the acquisition system, provides shielding to the common mode interference, and provides the creepage and clearance spacing desired to achieve high differential voltage ratings. In other words, certain test systems may place stringent constraints on the test setup. For example, some test systems extend the differential input voltage range to greater than one kilovolt (kV). Accordingly, a probe tip structure may be employed to provide the creepage and clearance spacing to achieve the higher voltages. This structure may still provide enough isolation and support high signal speeds above 1 Gigahertz (GHz).

By creating a probe tip to engage two square (or round) pins at a specified spacing and transition a corresponding signal into a coaxial interface, as discussed below, the disclosed mechanisms preserve the differential signal while shielding the differential signal from the common mode interference. The probe tip also addresses the issues mentioned above. The construction of the probe tip body provides high isolation from common-mode interference that would otherwise interfere with signal integrity. The coaxial interface and cabling from the probe tip to the sensor head preserves the differential signal from the DUT to the sensor head. The probe tip is designed to be inserted over a set of pins. The probe tip may then be left in the circuit while the circuit is energized, which results in eliminating the need to hold the probe tip onto the test points. This may reduce shock risk, which may be important when hazardous voltages are present in the area.

Disclosed herein is a shielded probe tip interface designed to reduce noise added to a test signal by a probe. The shielded probe tip may be employed for testing a differential signal via pins on a DUT, the differential signal including a test signal and a corresponding reference signal. The probe tip includes an insulating spacer element with a signal port for a signal pin and a reference port for a reference pin. When engaged, the insulating spacer element abuts the circuit board and/or pin header, and hence shields the pins from electrical interference from each other and/or adjacent pins. The reference port may also include a contact element of conductive material, such as a clip. The contact element may engage a reference pin directly to a reference body in the probe tip. Such direct engagement between the reference pin and the reference body supports consistent measurement and reduces impedance of the probe tip in the reference path. This results in increased measurement accuracy and test signal transfer quality, respectively, for the reference signal. Further, test probes may include attenuators to minimize capacitive loading along the test signal path. The disclosed probe tip may include a socket for receiving the signal pin and an attenuator connected directly to the socket. By directly connecting the attenuator to the socket, the inductance and capacitance along the signal path are reduced. Hence, the test signal path also provides a more accurate test signal. By increasing the accuracy of both the test signal and the reference signal, the resulting noise is decreased and the Signal to Noise Ratio (SNR), and hence the signal quality, of the differential signal is improved.

FIG. 1 is a cross sectional side view of an example shielded probe tip 100. For clarity of discussion, the shielded probe tip 100 and corresponding components are discussed in terms of proximate ends and distal ends. As used herein, proximate indicates the portion of a component closest to a DUT circuit board, when engaged, and distal indicates the portion of a component farthest away from a the DUT circuit board, when engaged. Hence, the probe tip 100 includes a proximate end 101 and a distal end 102. The probe tip 100 is designed to accept differential signals or other signal pairs. Hence, the probe tip 100 includes a signal path for a test signal and a reference path for a reference signal. The differential signal is a difference between test signal values and reference signal values (e.g. between a positive voltage and a negative voltage). The signal path includes a socket 110, an attenuator 112, a signal coupler 114, and a cable 120. The reference path includes contact element 136, a reference body 132, a reference coupler 134, and the cable 120. The probe tip 100 also includes an insulating spacer element 140 with a signal port 141 and a reference port 142. These and other components are now discussed in more detail.

The socket 110 is a component made of electrically conductive material at a proximate end 101 of the probe tip 100. The socket 110 may be any conductive device capable of receiving a signal pin from a DUT and electrically conducting a test signal from the signal pin along the signal path. In other words, the socket 110 may act as a center contact for the differential signal after leaving the DUT, while providing high isolation from common mode emissions due, in part, to the insulating spacer element 140. The socket 110 includes a concavity 111 to receive the signal pin and retain the signal pin in electrical communication with other probe tip 100 components while the probe tip 100 is engaged. The concavity 111 may be sized with a depth sufficient to receive the length of a signal pin through the insulating spacer element 140, resulting in the insulating spacer element 140 abutting the circuit board or header on the DUT supporting the signal pin.

The distal end of the socket 110 is electrically coupled to the attenuator 112. When a test signal is forwarded toward a test system, current is drawn across the probe 100. Drawing such current from the DUT changes the electrical conditions at the DUT. This is known as signal loading. The attenuator 112 is any signal component to provide impedance and hence reduce current draw and corresponding signal loading. The proximate end of the attenuator 112 may be affixed directly to the distal end of the socket 110 to maintain electrical communication with the socket 110. Electrical communication, as used herein, indicates an electrically conductive contact that provides a path for electrical charge to flow between corresponding components. The attenuator 112 may also include elastomers on the proximate end and/or the distal end of the attenuator 112, and may be directly affixed via the elastomers (e.g. without an intervening wire/cable). The elastomers are conductive, and allow the attenuator to be forcibly compressed against the coupled components (e.g. the socket 110 and the signal coupler 114) during manufacturing. The attenuator 112 adds an impedance between the proximate end of the attenuator 112 and the distal end of the socket 110. By directly connecting the attenuator 112 to the socket 110, the capacitance is reduced, which may improve the frequency response of the probe tip 100 along the signal path. Further, directly connecting the attenuator 112 to the socket 110 may reduce uncontrolled impedance, resulting in a better controlled impedance of the probe tip 100. The attenuator 112 is surrounded by an insulative member 113 of non-conductive material. The insulative member 113 isolates the attenuator 112 from the reference body 132 and prevents corresponding electrical shorts.

The signal coupler 114 accepts the cable 120 at the distal end of the probe tip 100 and holds a core of the cable 120 against, and in electrical communication, with the attenuator 112 at the proximate end. The signal coupler 114 may act as a Radio Frequency (RF) connector for transmission of the differential signal over the coaxial cable 120. The signal coupler 114 includes conductive material and has the effect of expanding the electrically conductive surface area of the core of the cable 120. This in turn increases the electrical conductivity between the cable 120 core and the attenuator 112. The cable 120 contains an internal core for electrically conducting the test signal and an external conductive shield for electrically conducting the reference signal (e.g. ground). As shown, the proximate end of the core of the cable 120 is inserted through the signal coupler 114 and affixed to the distal end of the attenuator 112. Hence, the cable 120 is in electrical communication with the distal end of the attenuator 112. The cable 120 conducts the test signal through the core and the reference signal along the external conductive shield toward the test and measurement system (e.g. oscilloscope) for testing.

The reference path extends through the reference body 132, which may also be referred to as a shield. The reference body 132 is made of conductive material. The reference body 132 is any component capable of conducting a reference signal from a reference pin toward the cable 120. As shown, the reference body 132 may surround the socket 110 at the proximate end 101 of the probe tip 100. The reference body 132 may also surround the attenuator 112 affixed to the socket 110. In some examples, the reference body 132 may also surround the proximate end of the cable 120. The reference body 132 may be separated from the socket 110 by the insulating spacer element 140 as discussed below. The reference body 132 is also separated from the attenuator 112 and the signal coupler 114 by a non-conductive material (e.g. the insulative member 113). When engaged, a reference pin abuts the reference body 132 via the reference port 142. The reference signal is conducted along the reference body 132 to the reference coupler 134. The reference signal is prevented from arcing to the signal path by the non-conductive material.

The reference coupler 134 is made of conductive material and conducts the reference signal to the external conductive shield of the proximate end of the cable 120. The reference coupler 134 may be soldered, or otherwise electrically and physically coupled, to the distal end of the reference body 132 and the proximate end of the cable 120. The reference coupler 134 also exerts physical pressure on the signal coupler 114 and the attenuator 112 to maintain the electrical connection between such components and the socket 110. The reference coupler 134 is separated from the signal coupler 114 by a plug 146 of nonconductive material to prevent arcing between the reference and signal paths. The plug 146 also maintains the position of the components and the pressure on the attenuator 112 during manufacturing (e.g. while the reference coupler 134 is being soldered).

The insulating spacer element 140 is positioned at the proximate end 101 of the probe tip 100. The insulating spacer element 140 is made of non-conductive material, and is formed to maintain creepage and clearance distances between pins. The insulating spacer element 140 surrounds the reference body 132 at the proximate end 101 of the probe tip 100. The insulating spacer element 140 is also affixed to the proximate end of the socket 110. The insulating spacer element 140 may also surround the socket 110 at the proximate end of the probe tip 100. Accordingly, the insulating spacer element 140 may extend between the socket 110 and the reference body 132, which electrically insulates the socket 110 from the reference body 132 and vice versa. The insulating spacer element 140 includes a signal port 141 to receive a signal pin into the socket 110. Specifically, the signal port 141 is an opening in the insulating spacer element 140 that aligns, in shape, size, and position, with the concavity 111 at the proximate end of the socket 110. It should be noted that, while the insulating spacer element 140 is depicted as protruding downward from the socket 110, the socket 110 may directly abut a circuit board or pin header in some examples. Further, the insulating spacer element 140 includes a reference port 142 to receive a reference pin and maintain the reference pin in electrical communication with the proximate end of the reference body 132. In other words, the reference port 142 is an opening in the insulating spacer element 140 that aligns with a sidewall of the reference body 132.

In operation, the insulating spacer element 140 is shaped to accept the signal pin and the reference pin into the test probe tip 100 while abutting a DUT surface. In other words, the insulating spacer element 140 may slide along the length of the pins until the proximate surface of the insulating spacer element 140 touches the circuit board of header holding the pins. This allows the insulating spacer element 140 to isolate the signal pins from any electric fields coming from other DUT pins, which would otherwise induce a current (e.g. noise) in the reference pin, the signal pin, or both. Accordingly, the proximate wall of the insulating spacer element 140 (e.g. that abuts the DUT) acts as a two pin contact engagement surface for both reference and high speed test signals.

The probe tip 100 also includes a contact element 136. The contact element 136 is positioned in the reference port 142. The contact element 136 may be any component capable of releasably maintaining the reference pin in electrical communication with the reference body 132. For example, the contact element 136 may a mechanical clip of conductive material in electrical communication with the reference body 132 as shown. However, other contact elements 136 may be used without departing from the scope of the present disclosure. The contact element 136 is depicted in a pre-contact state and hence shown as pressed inward toward the reference body 132. The contact element 136 is depicted in an engaged state in FIG. 2. The contact element 136 supports maintaining a direct reliable engagement between the reference pin and the reference body 132. This in turn ensures that a consistently stable electrical path exists between the reference pin and the reference body 132. Accordingly, the contact element 136 allows the user to take consistent repeatable measurements. The contact element 136 may also be conductive, and hence may act as an additional path between the reference pin and the reference body 132. As such, by maintaining the reference pin to the reference body 132, impedance of the probe tip in the reference path is reduced, which results in increased transfer quality for the reference signal.

Figure 2:
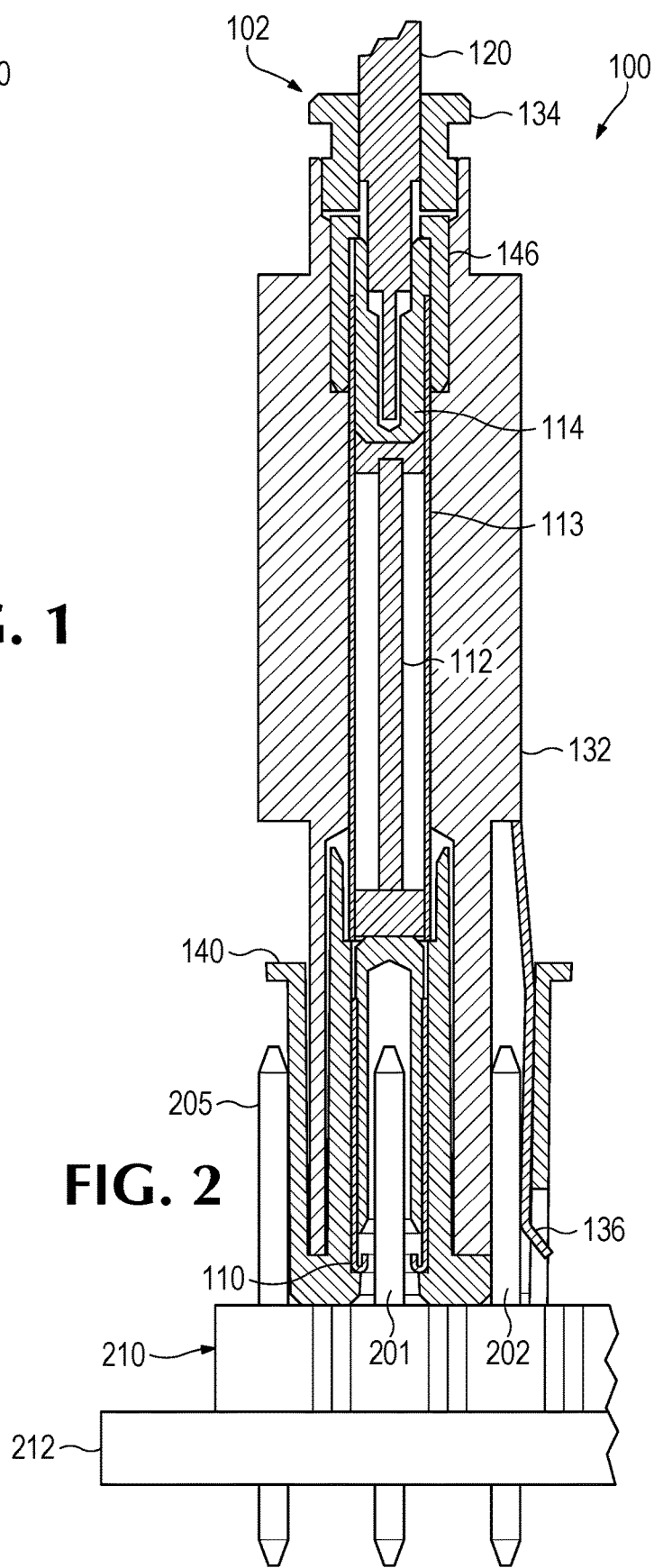
FIG. 2 is a cross sectional side view of the example shielded probe tip engaged to differential pins on a DUT circuit board.

FIG. 2 is a cross sectional side view of the example shielded probe tip 100 engaged to differential pins on a DUT circuit board 212. A DUT circuit board 212 may contain an array of pins as shown. The pins may be soldered directly to the circuit board 212 in some examples. In other examples, the pins may be attached to a header 210. In the example shown, a signal pin 201 includes the test signal and a reference pin 202 includes the reference signal. Other adjacent pins 205 may contain other signals that are not relevant to the differential signal under test. As shown, the insulating spacer element 140 is shaped to accept the signal pin 201 and the reference pin 202 into the test probe tip 100 while abutting a DUT surface, in this case the header 210.

Specifically, the signal pin 201 may be slid through the insulating spacer element 140 via the signal port 141 and into the socket 140. The insulating spacer element 140 abuts the header 210, and therefore mitigates unwanted electrical communication/interference between the signal pin 201 and the adjacent pins 205. Further, the reference pin 202 may be slid through the insulating spacer element 140 via the reference port 142 and pressed against the reference body 132. The contact element 136 may move to allow the reference pin 202 into the reference port 142, and may employ mechanical pressure to maintain the contact between the reference pin 202 and the reference body 132. The insulating spacer element 140 may surround the reference port 142 and abut that header 210. Hence, the insulating spacer element 140 also mitigates electrical contact between adjacent pins 205 and the reference pin 202. As the insulating spacer element 140 extends above the adjacent pins 205 and surrounds the socket 140 and the proximate end of the reference body 132, the insulating spacer element 140 also mitigates electrical contact between adjacent pins 205, the socket 140, and the reference body 132. In other words, the insulating spacer element 140 is designed to electrically insulate the reference pin 202, the reference body 132, the socket 140, and the signal pin 201 from adjacent pins 205. This configuration may effectively eliminate interference from adjacent pins 205.

It should also be noted that thickness and spacing of the sidewalls of the insulating spacer element 140 as well as the location of the signal port 141 and the reference port 142 may be altered depending on the relative positions of the signal pin 201, reference pin 202, and adjacent pins 205. For example, a distance between the signal port 141 and the reference port 142 is selected based on pin pitch of the DUT pins. In the example shown, the pin pitch is 0.100 inches, which indicates a distance of 2.54 millimeters (mm) between the center of the signal pin 201 and the center of the reference pin 202. A wider pin pitch would result in wider spacing between the signal port 141 and the reference port 142. Further, the width of the sidewalls of the insulating spacer element 140 may be selected based on pin pitch. As shown, the width between the signal port 141 and the insulating spacer element 140 side wall adjacent to the signal port 141 is selected so that the insulating spacer element 140 does not put mechanical pressure on the adjacent pins 205. Likewise, the width between the reference port 142 and the insulating spacer element 140 side wall adjacent to the reference port 142 is selected to so that the insulating spacer element 140 does not put mechanical pressure on the adjacent pins 205. This allows the insulating spacer element 140 to abut the header 210 despite the presence of the adjacent pins 205.

Figure 3:
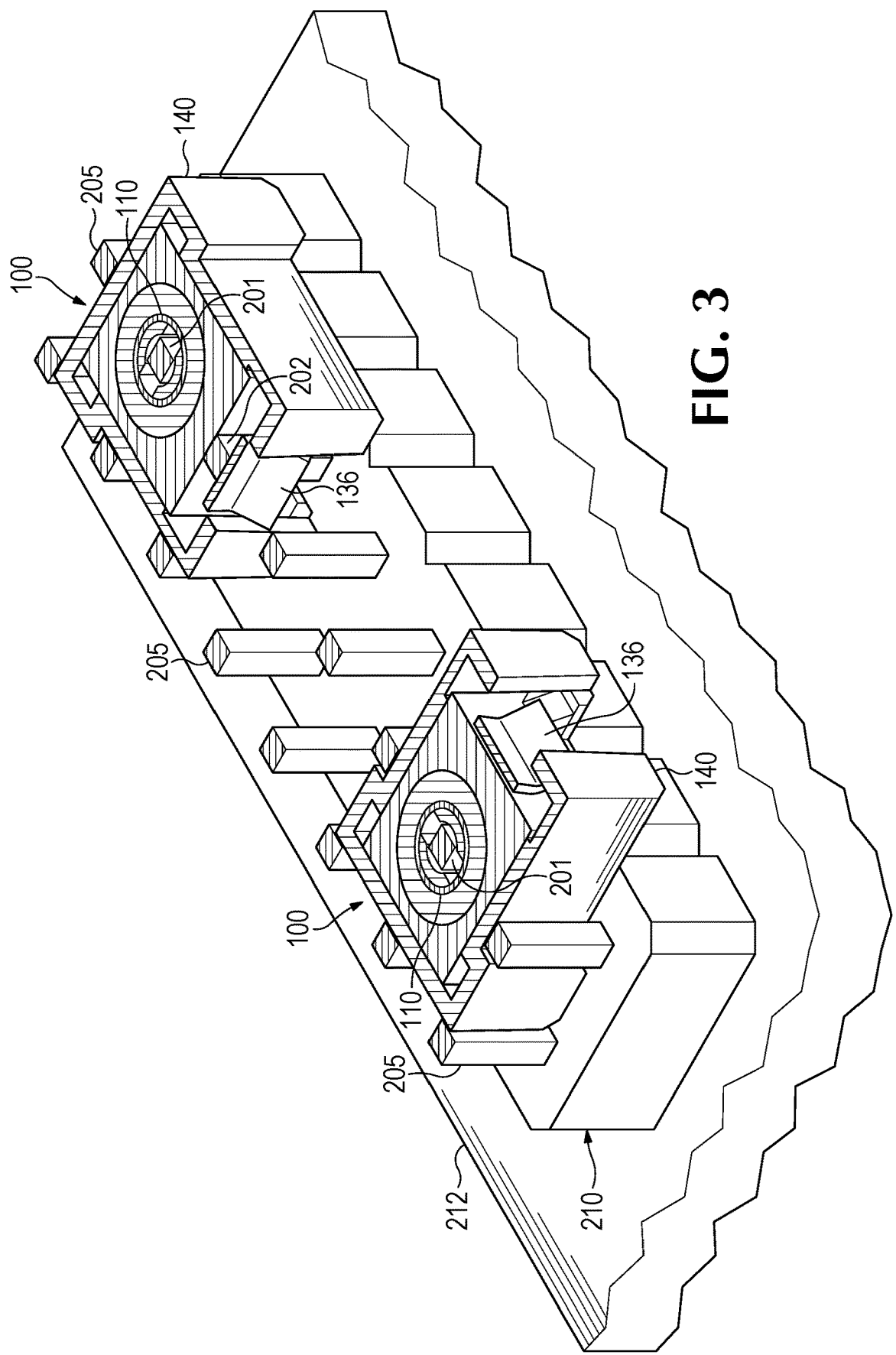
FIG. 3 is a cross sectional isometric view of example shielded probe tips engaged to pins on a DUT circuit board.

FIG. 3 is a cross sectional isometric view of example shielded probe tips 100 engaged to pins on a DUT circuit board 212. Specifically, FIG. 3 shows the same probe tip 100 (or multiple substantially similar probe tips 100) coupled to pins in different configurations. As shown, the shape of the insulating spacer element 140 allows the probe tip 100 to couple to differential pins in a horizontal or a vertical direction on two rows of pins as shown, on three rows of pins, etc. Further, the shape of the insulating spacer element 140 provides guidance during installation/engagement of the probe tip 100 to the pins. In addition, the insulating spacer element 140 nests around the pins allowing insulation of the signal pin and reference pin from unrelated pins.

Figure 4:
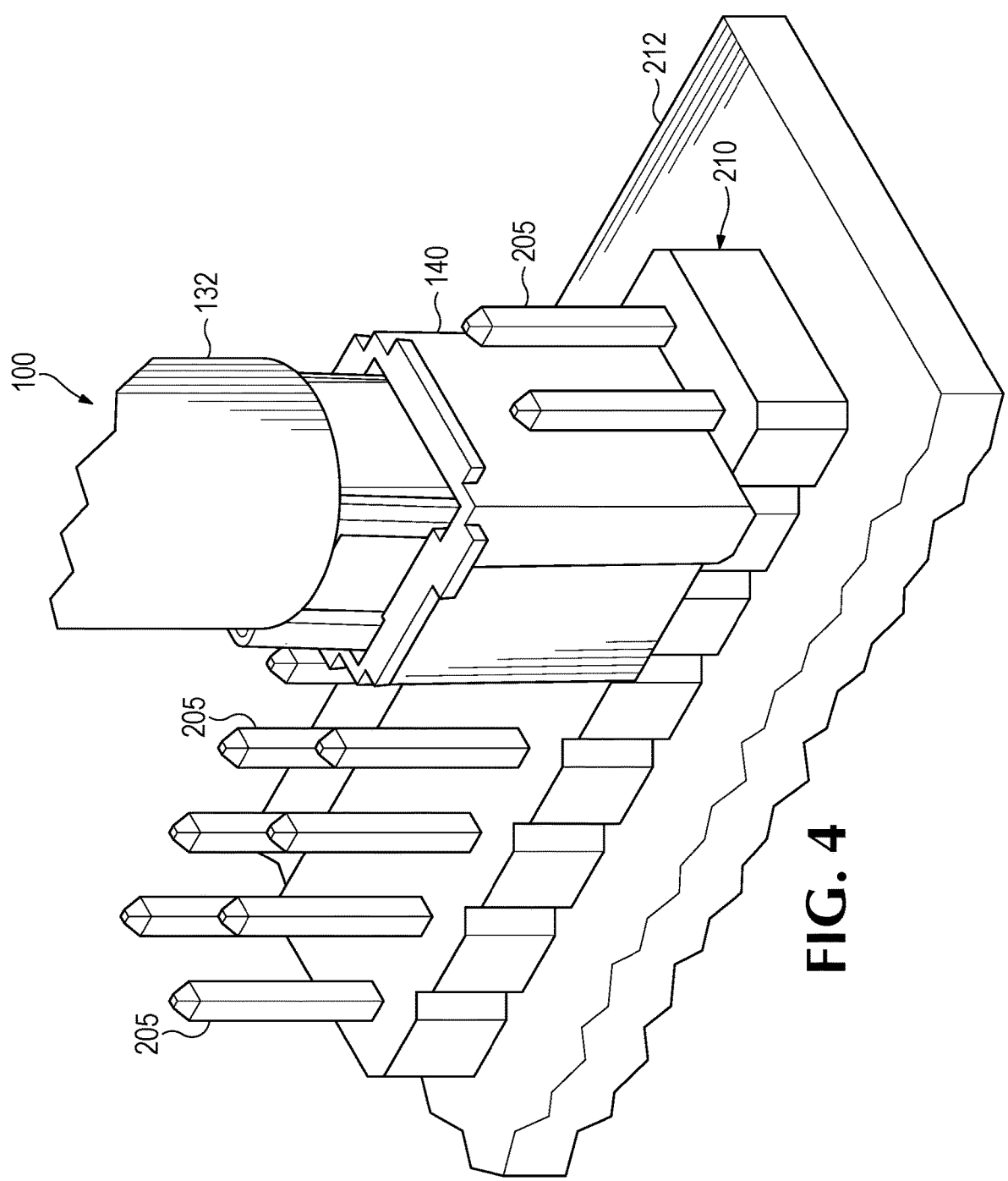
FIG. 4 is an isometric side view of the example shielded probe tip engaged to differential pins on a DUT circuit board.

FIG. 4 is an isometric side view of the example shielded probe tip 100 engaged to differential pins on a DUT circuit board 212. As further shown in FIG. 4, the probe tip 100 may nest within an array of adjacent pins 205 (e.g. square or round) in multiple configurations while only making electrical contact with signal pin and the reference pin. In FIG. 4, the signal pin and reference pin are inserted into the insulating spacer element 140, and hence are not seen.

Figure 5:
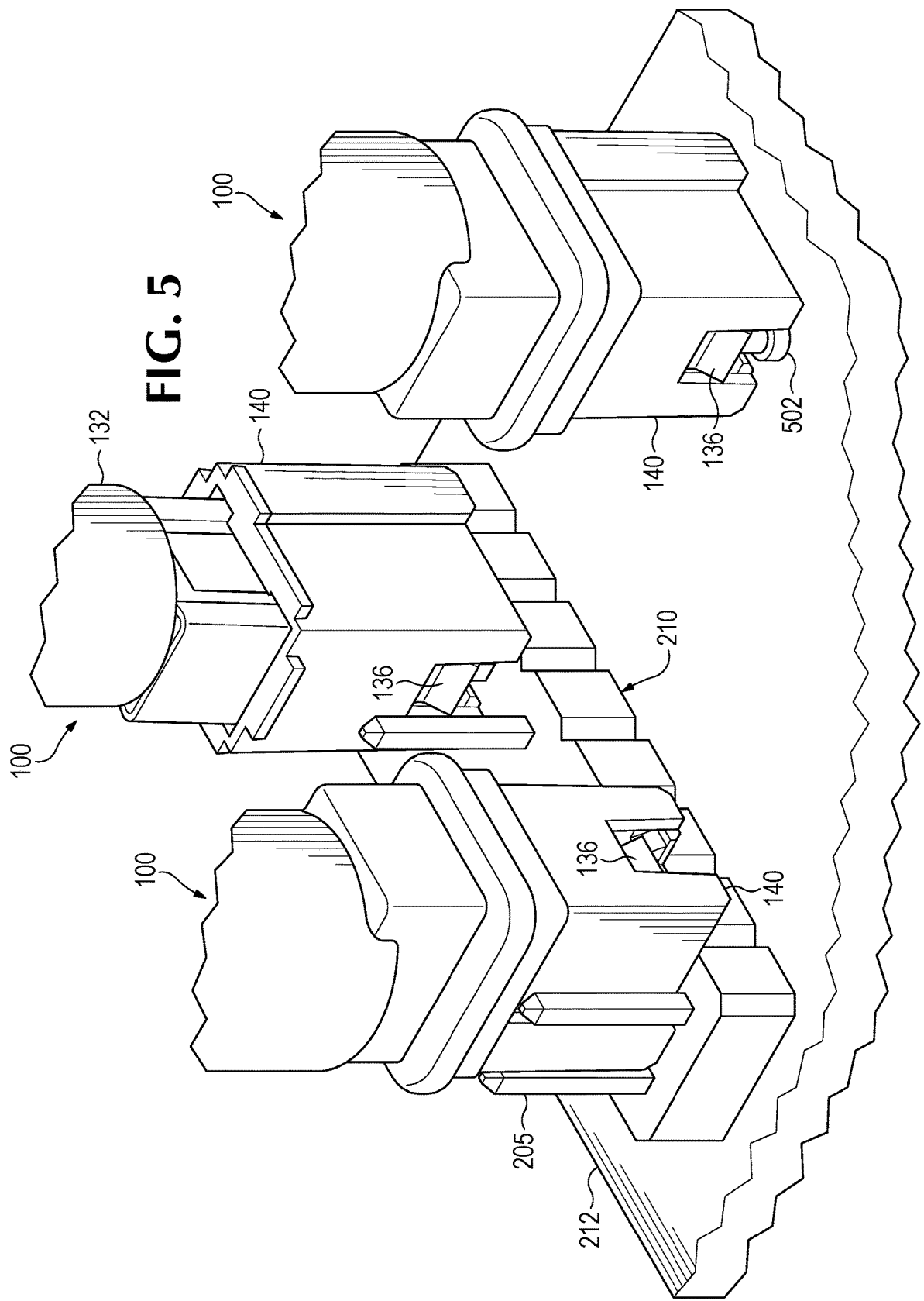
FIG. 5 is an isometric side view of example shielded probe tips engaged to header pins and directly soldered pins.

FIG. 5 is an isometric side view of example shielded probe tips 100 engaged to header 210 pins and directly soldered pins 502. Specifically, FIG. 5 shows the same probe tip 100 (or multiple substantially similar probe tips 100) coupled to pins in different configurations. As shown, the circuit board 212 may include a header 210 with reference pins 202, signal pins 201, and adjacent pins 205. The circuit board 212 may also include directly soldered pins 502, which are any signal/reference pin directly installed on a circuit board 212 without an intervening header 210. The probe tip 100 may engage with any such pins. When the probe tip 100 engages with the directly soldered pins 502, the DUT surface abutted by the insulating spacer element is the circuit board 212. When the probe tip 100 engages with the pins engaged to the header 210, the DUT surface abutted by the insulating spacer element is the header 210. The directly soldered pins 502 may provide slightly better performance than the header 210 mounted pins. However, such difference depends on the nature of the DUT and is beyond the control of the probe tip 100.

Figure 6:
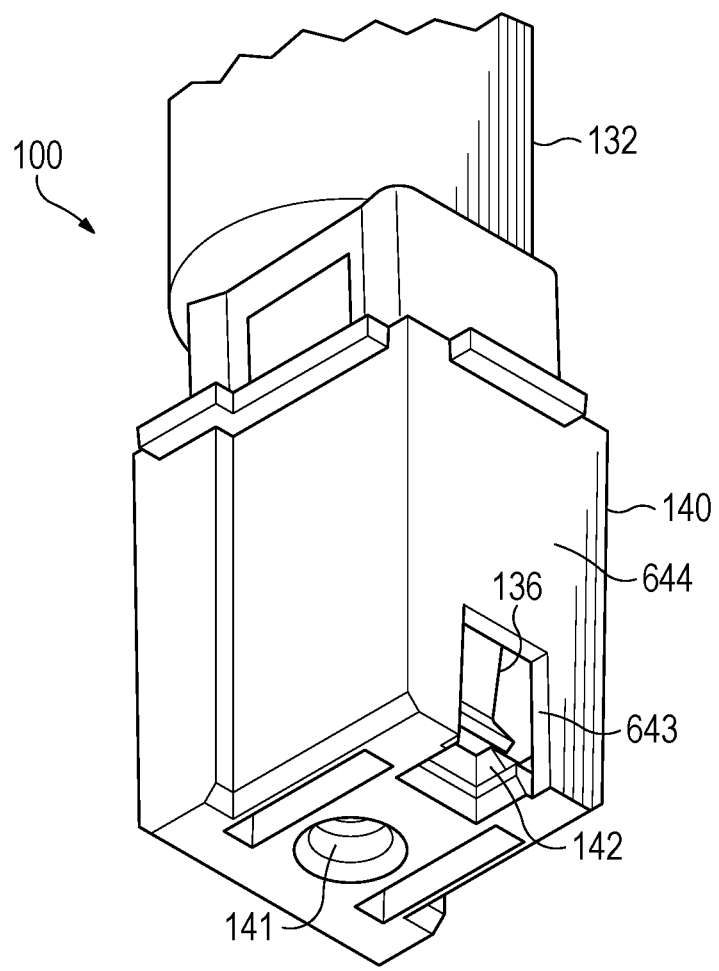
FIG. 6 is an isometric bottom view the example shielded probe tip.

FIG. 6 is an isometric bottom view the example shielded probe tip 100. The insulating spacer element 140 includes a signal sidewall adjacent to the signal port 141 and a reference sidewall 644 adjacent to the reference port 142, respectively. The insulating spacer element 140 may also include a first grip sidewall and a second grip sidewall. Each of the sidewalls may abut adjacent pins. Further, the reference sidewall 644 may include a contact opening 643. The contact opening 643 is shaped to support contact element 136 movement during release or engagement of the reference pin. For example, when the contact element 136 is a clip, as shown, the contact element 136 may be extended outward when the reference pin is pushed into the reference port 142. The contact element 136 may then exert mechanical pressure on the reference pin by attempting to retract. This mechanism maintains the reference pin in place. The contact opening 643 provides a space for movement of the proximate portion of the contact element 136 when the clip is extended.

Aspects of the present disclosure operate with various modifications and in alternative forms. Specific aspects have been shown by way of example in the drawings and are described in detail herein below. However, it should be noted that the examples disclosed herein are presented for the purposes of clarity of discussion and are not intended to limit the scope of the general concepts disclosed to the specific examples described herein unless expressly limited. As such, the present disclosure is intended to cover all modifications, equivalents, and alternatives of the described aspects in light of the attached drawings and claims.

References in the specification to embodiment, aspect, example, etc., indicate that the described item may include a particular feature, structure, or characteristic. However, every disclosed aspect may or may not necessarily include that particular feature, structure, or characteristic. Moreover, such phrases are not necessarily referring to the same aspect unless specifically noted. Further, when a particular feature, structure, or characteristic is described in connection with a particular aspect, such feature, structure, or characteristic can be employed in connection with another disclosed aspect whether or not such feature is explicitly described in conjunction with such other disclosed aspect.

EXAMPLES

Illustrative examples of the technologies disclosed herein are provided below. An embodiment of the technologies may include any one or more, and any combination of, the examples described below.

Example 1 includes a differential test probe tip comprising: a socket of electrically conductive material at a proximate end of the probe tip, the socket including a concavity to receive a signal pin; a reference body of conductive material adjacent to the socket; and insulating spacer element of non-conductive material surrounding the reference body at the proximate end of the probe tip, the insulating spacer element including: a signal port to receive the signal pin into the socket, and a reference port to receive a reference pin and maintain the reference pin in electrical communication with a proximate end of the reference body.

Example 2 includes the differential test probe tip of Example 1, wherein the insulating spacer element is shaped to accept the signal pin and the reference pin into the test probe tip while abutting a Device Under Test (DUT) surface.

Example 3 includes the differential test probe tip of Example 2, wherein the DUT surface is a pin header or a circuit board.

Example 4 includes the differential test probe tip of any one of Examples 1-3, wherein the insulating spacer element extends between the socket and the reference body.

Example 5 includes the differential test probe tip of any one of Examples 1-4, wherein the insulating spacer element surrounds the reference port and electrically shields the reference pin, reference body, signal pin, and socket from adjacent Device Under Test (DUT) pins.

Example 6 includes the differential test probe tip of any one of Examples 1-5, wherein the socket includes a proximate end affixed to the insulating spacer element and a distal end, the test probe tip further comprising an attenuator affixed directly to, and in electrical communication with, the distal end of the socket.

Example 7 includes the differential test probe tip of any one of Examples 1-6, wherein the reference body surrounds the attenuator affixed to the socket, the reference body separated from the attenuator by non-conductive material.

Example 8 includes the differential test probe tip of any one of Examples 1-7, further comprising a contact element positioned in the reference port, the contact element to releasably maintain the reference pin in electrical communication with the reference body.

Example 9 includes the differential test probe tip of any one of Example 8, wherein the contact element is a mechanical clip of conductive material in electrical communication with the reference body.

Example 10 includes the differential test probe tip of any one of Examples 8-9, wherein the insulating spacer element includes a reference sidewall adjacent to the reference port, the reference sidewall including a contact opening shaped to support contact element movement during release of the reference pin.

Example 11 includes a test probe tip comprising: a socket of electrically conductive material at a proximate end of the probe tip, the socket including a proximate end with a concavity to receive a signal pin, and a distal end; an attenuator with a proximate end affixed directly to, and in electrical communication with, the distal end of the socket, and a distal end; and a cable at a distal end of the probe tip, the cable in electrical communication with the distal end of the attenuator.

Example 12 includes the test probe of Example 11, further comprising an insulating spacer element of non-conductive material surrounding the socket at the proximate end of the probe tip, the insulating spacer element including a signal port to receive the signal pin into the socket.

Example 13 includes the test probe of Example 12, wherein the insulating spacer element is shaped to accept the signal pin into the test probe tip while abutting a Device Under Test (DUT) surface.

Example 14 includes the test probe of any one of Examples 11-13, further comprising a reference body of conductive material surrounding the socket, the attenuator, and a proximate end of the cable.

Example 15 includes the test probe of any one of Examples 12-14, wherein the insulating spacer element further includes a reference port to receive a reference pin and maintain the reference pin in electrical communication with a proximate end of the reference body.

Example 16 includes the test probe of any one of Examples 12-15, wherein the insulating spacer element mitigates electrical communication between adjacent DUT pins, the reference pin, and the signal pin.

Example 17 includes the test probe of any one of Examples 12-16, wherein the insulating spacer element mitigates electrical communication between adjacent DUT pins, the socket, and the reference body.

Example 18 includes the test probe of any one of Examples 11-17, further comprising a contact element positioned in the reference port, the contact element to releasably maintain the reference pin in electrical communication with the reference body.

Example 19 includes the test probe of Example 18, wherein the contact element is a mechanical clip of conductive material in electrical communication with the reference body.

Example 20 includes the test probe of any one of Examples 11-19, wherein a distance between the signal port and the reference port is selected based on pin pitch of the DUT.

The previously described examples of the disclosed subject matter have many advantages that were either described or would be apparent to a person of ordinary skill. Even so, all of these advantages or features are not required in all versions of the disclosed apparatus, systems, or methods.

Additionally, this written description makes reference to particular features. It is to be understood that the disclosure in this specification includes all possible combinations of those particular features. Where a particular feature is disclosed in the context of a particular aspect or example, that feature can also be used, to the extent possible, in the context of other aspects and examples.

Also, when reference is made in this application to a method having two or more defined steps or operations, the defined steps or operations can be carried out in any order or simultaneously, unless the context excludes those possibilities.

Although specific examples of the disclosure have been illustrated and described for purposes of illustration, it will be understood that various modifications may be made without departing from the spirit and scope of the disclosure. Accordingly, the disclosure should not be limited except as by the appended claims.

We claim:

1. A differential test probe tip comprising:
    a socket of electrically conductive material at a proximate end of the probe tip, the socket including a concavity to receive a signal pin;
    a reference body of conductive material adjacent to the socket; and
    an insulating spacer element of non-conductive material surrounding the reference body at the proximate end of the probe tip, the insulating spacer element including:
        a signal port to receive the signal pin into the socket, and
        a reference port to receive a reference pin and maintain the reference pin in electrical communication with a proximate end of the reference body;
    wherein the insulating spacer element is shaped to accept the signal pin and the reference pin into the test probe tip while a proximate wall of the insulating spacer element abuts a Device Under Test (DUT) surface, and to isolate the signal pin from an electrical field from an adjacent DUT pin.

2. The differential test probe tip of claim 1, wherein the signal pin and the reference pin convey a differential signal and the insulating spacer element is shaped to isolate the signal pin and the reference pin from common-mode interference.

3. The differential test probe tip of claim 2, wherein the DUT surface is a pin header or a circuit board.

4. The differential test probe tip of claim 1, wherein the insulating spacer element extends between the socket and the reference body.

5. The differential test probe tip of claim 1, wherein the insulating spacer element surrounds the reference port and electrically shields the reference pin, reference body, signal pin, and socket from adjacent Device Under Test (DUT) pins.

6. The differential test probe tip of claim 1, wherein the socket includes a proximate end affixed to the insulating spacer element and a distal end, the test probe tip further comprising an attenuator affixed directly to, and in electrical communication with, the distal end of the socket.

7. The differential test probe tip of claim 6, wherein the reference body surrounds the attenuator affixed to the socket, the reference body separated from the attenuator by non-conductive material.

8. The differential test probe tip of claim 1, further comprising a contact element positioned in the reference port, the contact element to releasably maintain the reference pin in electrical communication with the reference body.

9. The differential test probe tip of claim 8, wherein the contact element is a mechanical clip of conductive material in electrical communication with the reference body.

10. The differential test probe tip of claim 8, wherein the insulating spacer element includes a reference sidewall adjacent to the reference port, the reference sidewall including a contact opening shaped to support contact element movement during release of the reference pin.

11. A test probe tip comprising:
    a socket of electrically conductive material at a proximate end of the probe tip, the socket including a proximate end with a concavity to receive a signal pin, and a distal end;
    an attenuator with a proximate end affixed directly to, and in electrical communication with, the distal end of the socket, and a distal end;

a coaxial cable at a distal end of the probe tip, the cable in electrical communication with the distal end of the attenuator;

an insulating spacer element of non-conductive material surrounding the socket at the proximate end of the probe tip, the insulating spacer element including a signal port to receive the signal pin into the socket; and a reference body of conductive material surrounding the socket, the attenuator, and a proximate end of the cable.

12. The test probe of claim 11, wherein the insulating spacer element is shaped to accept the signal pin into the test probe tip while abutting a Device Under Test (DUT) surface.

13. The test probe of claim 11, wherein the insulating spacer element further includes a reference port to receive a reference pin and maintain the reference pin in electrical communication with a proximate end of the reference body.

14. The test probe of claim 13, wherein the insulating spacer element mitigates electrical communication between adjacent DUT pins, the reference pin, and the signal pin.

15. The test probe of claim 13, wherein the insulating spacer element mitigates electrical communication between adjacent DUT pins, the socket, and the reference body.

16. The test probe of claim 13, further comprising a contact element positioned in the reference port, the contact element to releasably maintain the reference pin in electrical communication with the reference body.

17. The test probe of claim 16, wherein the contact element is a mechanical clip of conductive material in electrical communication with the reference body.

18. The test probe of claim 13, wherein a distance between the signal port and the reference port is selected based on pin pitch of the DUT.

\* \* \* \* \*